(12) United States Patent
Nair et al.

(10) Patent No.: US 6,589,845 B1
(45) Date of Patent: Jul. 8, 2003

(54) METHOD OF FORMING A SEMICONDUCTOR DEVICE AND STRUCTURE THEREFOR

(75) Inventors: Rajesh S. Nair, Chandler, AZ (US); Zia Hossain, Tempe, AZ (US); Takeshi Ishiguro, Aizuwakamatsu (JP); Mohamed Imam, Tempe, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 10/195,166

(22) Filed: Jul. 16, 2002

(51) Int. Cl.[7] ............................................. H01L 21/336
(52) U.S. Cl. ...................................................... 438/268
(58) Field of Search ................................ 438/268, 272, 438/275, 279, 282

(56) References Cited

U.S. PATENT DOCUMENTS 6,097,063 A    8/2000   Fujihira

2002/0027237 A1 * 3/2002 Onishi et al. ................ 257/262
2002/0088990 A1 * 7/2002 Iwamoto et al. ............. 257/136

OTHER PUBLICATIONS

"Simulated Superior Performances of Semiconductor Super-junction Devices", Tatsuhiko Fujihira et al, *Proceedings of 1998 International Symposium on Power Semiconductor Devices & Ics*, Kyoto, pp. 423–426.

* cited by examiner

Primary Examiner—Craig Thompson

(57) ABSTRACT

A method of forming a semiconductor device (10, 40, 45, 50) forms a plurality of P and N stripes (16,17) within a first region (12) that is formed with an opposite conductivity to a substrate (11). The plurality of P and N stripes assist in providing a low on-resistance. A portion (15) of the first region underlies the P and N stripes and protects the semiconductor device from high voltages applied to the drain. A base layer (41) and a cap layer (48) further reduce the on-resistance of the semiconductor device.

7 Claims, 7 Drawing Sheets

METHOD OF FORMING A SEMICONDUCTOR DEVICE AND STRUCTURE THEREFOR

BACKGROUND OF THE INVENTION

The present invention relates, in general, to electronics, and more particularly, to methods of forming semiconductor devices and structures.

In the past, the semiconductor industry utilized various techniques to produce transistors that have a low on-resistance and a high breakdown voltage. One particular technique utilized a plurality of P and N type strips arranged on a P-type semiconductor substrate. One example of such a structure is disclosed in U.S. Pat. No. 6,097,063 entitled "Semiconductor Device Having A Plurality of Parallel Drift Regions" issued to Tatsuhiko Fujihira on Aug. 1, 2000. When such a device was connected as a high side driver, latch-up often occurred and the transistor was damaged or destroyed. Another problem was that the on-resistance often changed after the device was manufactured. Further, to obtain a usable on-resistance, the stripes had to be deep and narrow resulting in increased manufacturing costs. Typically, the depth was greater than two microns while the width was greater than one-half micron. Such an aspect ratio made the device difficult to manufacture.

Accordingly, it is desirable to have a transistor with a low on-resistance, that can also be connected as a high side driver and that does not latch-up or damage the transistor, that has reduced manufacturing costs, and that has an on-resistance that does not drift after manufacturing.

BRIEF DESCRIPTION OF THE DRAWINGS

For simplicity and clarity of illustration, elements in the figures are not necessarily to scale, and the same reference numbers in different figures denote the same elements. Additionally, descriptions and details of well known steps and elements are omitted for simplicity of the description.

DETAILED DESCRIPTION OF THE DRAWINGS

The present description includes a method of forming a semiconductor device having, among other features, both a low on-resistance and a high breakdown voltage.

Figure 1:
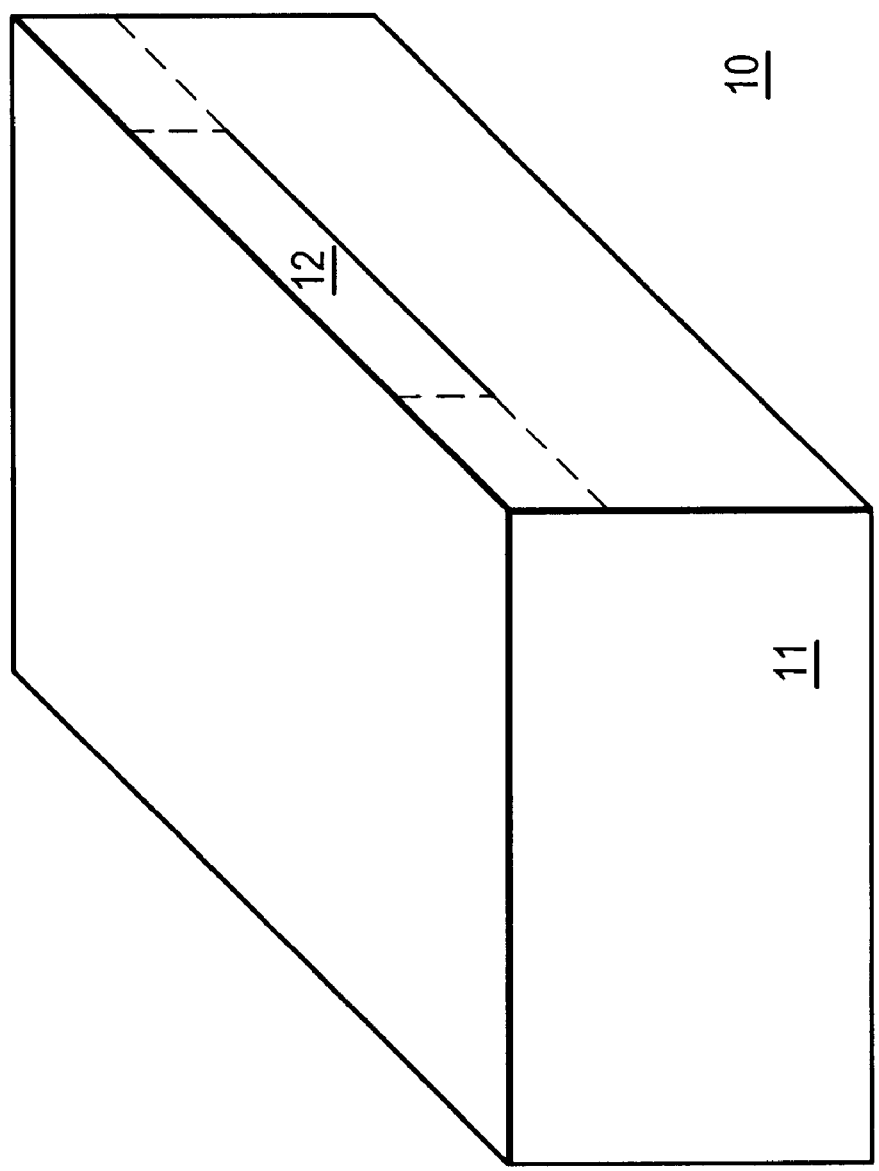
FIG. 1 schematically illustrates and enlarged cross-sectional isometric portion of an embodiment of a semiconductor device at a stage of manufacturing in accordance with the present invention.

FIG. 1 schematically illustrates an enlarged cross-sectional isometric portion of an embodiment of a semiconductor device 10 at an early manufacturing stage. Device 10 includes a semiconductor substrate 11 that is provided with a first conductivity type, preferably P-type. A first region 12 of a second conductivity type that is opposite in conductivity to the first conductivity type is formed on a surface of substrate 11 and extending into substrate 11. As illustrated by dashed lines generally illustrating two alternate boundaries for first region 12, first region 12 may be formed by a variety of techniques including forming a layer on the surface of substrate 11, for example by forming an epitaxial layer, or forming a well or doped region on the surface of substrate 11. In the preferred embodiment, first region 12 is formed as an N-type well by ion implantation or diffusion techniques that are well known to those skilled in the art.

Figure 2:
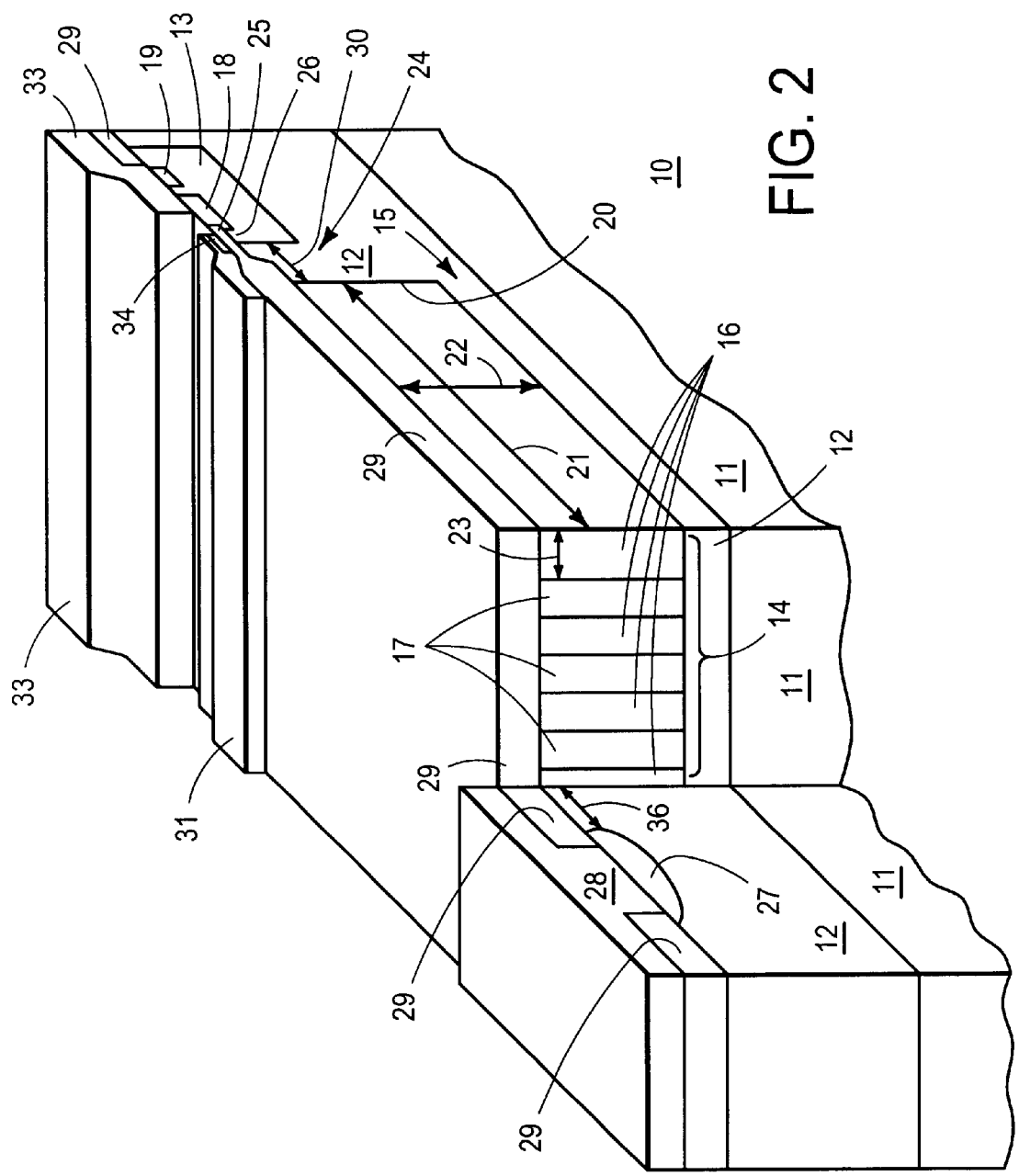
FIG. 2 schematically illustrates the semiconductor device of FIG. 1 at a subsequent manufacturing stage in accordance with the present invention.

FIG. 2 schematically illustrates a further enlarged cross-sectional isometric portion of semiconductor device 10 at a subsequent manufacturing stage after various other elements are formed. Device 10 includes a drain region or drain 27, a well 13 having a portion which forms a channel region 26, a source region or source 18 formed within well 13, and a group of drift stripes 14 that assist in providing device 10 a low on-resistance and a high breakdown voltage.

A low on-resistance provides device 10 with a large current carrying capacity, the high breakdown voltage permits using device 10 in applications that utilize high voltages. Device 10 also has a low resistivity that allows device 10 to be small for a desired on-resistance or for a desired power dissipation level. It is often difficult or expensive to manufacture a semiconductor device that achieves both a high breakdown voltage and a low on-resistance or high current capacity. A low on-resistance often is achieved by low resistance current paths and the low resistance regions typically have a low breakdown voltage due to the high charge concentrations required to achieve the low resistance. However, the method of forming device 10 provides both a high breakdown voltage and a low on-resistance.

Drain 27 is formed on a surface of and extending into first region 12. Drain 27 is formed as a region of the second conductivity type by well known techniques such as ion implantation, diffusion, and other similar techniques. The doping concentration of drain 27 generally is high to provide a low resistance connection to a drain electrode 28.

Drift stripes 14 are formed within a first section of first region 12. Drift stripes 14 are created by forming a plurality of alternating stripes comprising a first stripe 16 of the first conductivity type abutting a second stripe 17 of the second conductivity type. In the preferred embodiment, each stripe 17 has an adjacent stripe 16 abutting each side, thus, each stripe 17 is between two stripes 16. In other embodiments, outside stripes may either be a stripe 17 or a stripe 16. All of stripes 16 and 17 typically are formed to extend a first distance or a lateral distance 21, illustrated in general by an arrow, laterally across first region 12 from near drain 27 toward well 13 and source 18. Each of stripes 16 and 17 are formed with a height 22 and a width 23 that is sufficient to accommodate a desired charge concentration and the associated doping concentrations as will be shown hereinafter. Typically stripes 14 have an aspect ratio that is no less than two to one (2:1) and preferably is greater than three to one (3:1). Typically height 22 is as large as possible for a particular manufacturing process to provide the lowest resistance while width 23 is as small as possible for a particular height 22 in order to provide the greatest packing density for stripes 14. Drift stripes 14 are formed within first region 12 so that a portion 15, generally denoted by an arrow, of first region 12 underlies drift stripes 14.

Well 13 is formed of the first conductivity type in a second section of first region 12, typically after forming drift stripes 14. Source 18 is formed as an area of the second conductivity type within well 13. Forming well 13 and source 18 within first region 12 facilitates using device 10 in various applications including those often referred to as high side driver applications. An optional source enhancement 19 may be formed in well 13 adjacent to source 18 to reduce parasitic affects within device 10. Well 13, source 18, and optional enhancement 19 are formed by semiconductor processing techniques that are well known to those skilled in the art. Source 18 is positioned a second distance from an edge of well 13 to form a channel region 26 within well 13. The length of the second distance between source 18 and the edge of well 13 forms a channel length for channel region 26. Well 13 is spaced laterally a third distance 30 from a first end 20 of drift stripes 14 so that a third section 24, illustrated generally by an arrow, of first region 12 is disposed between well 13 and end 20 of drift stripes 14. A gate insulator 25 is formed at least overlying channel region 26 and may extend over a portion of source 18. An insulation layer 29 is formed on a portion of device 10 and openings are formed therein to facilitate forming drain electrode 28 contacting drain 27 and a source electrode 33 contacting source 18 and optional enhancement 19. A gate 34 is formed overlying insulator 25 and channel region 26, and a gate electrode 31 is formed in electrical contact with gate 34. Drain 27 is spaced from stripes 14 by distance 36, generally illustrated by an arrow, to form a fourth section of first region 12 between drain 27 and stripes 14.

Third section 24 improves the breakdown voltage of device 10. If stripes 14 abut well 13, the peak electric field in the region underlying gate insulator 25 is higher than if well 13 and stripes 14 are separated. Third section 24 is formed to provide the separation. Also, well 13 typically is at a ground potential and stripes 14 are at a higher potential, thus, if well 13 touches stripe 17 a depletion region is formed at the intersection and this depletion region reduces the ability of the electric field to spread out over the area of well 13. This is often referred to as the pinch-off effect. Consequently, section 24 separates well 13 from stripes 17 to minimize the peak electric field and to also minimize the pinch-off effect. The amount of the separation or the value of distance 30 is chosen to minimize the peak surface electric field. The peak surface electric field (and hence the maximum voltage that can be applied before the onset of breakdown) occurs in the region underlying gate electrode 31 and particularly underlying the gate insulator 25. Distance 30 should be at least greater than zero and typically is about one micron.

Because first region 12 and substrate 11 are of opposite conductivity types, a P-N junction and an associated depletion region are formed along the interface of the two regions. Device 10 typically is formed on substrate 11 along with several other semiconductor devices (not shown in FIG. 2), thus, substrate 11 generally is connected to the lowest voltage, such as ground, to ensure operation of the other semiconductor devices. The depletion region formed by first region 12 and substrate 11 blocks current flow from drain 27 and drift stripes 14 into substrate 11 thereby isolating device 10 from substrate 11 and also from other devices (not shown) that may be formed on substrate 11 thereby preventing damage to device 10. When device 10 is in an off-state, a high voltage is applied between drain 27 and source 18. Because region 13 is enclosed within well 12, device 10 can be used in applications such as high side driver applications.

Because stripes 16 and 17 are of opposite conductivity type, a P-N junction and an associated depletion region is formed at the interface between and extending into each stripe 16 and stripe 17. Stripes 17 are of the same conductivity type as first region 12, thus, when device 10 is in the on-state both stripes 17 and first region 12 support current flow through device 10. Those skilled in the art realize that in the on-state there is a voltage drop from drain 27 to source 18 that results in some slight depletion along drift stripes 14 near drain 27. First region 12 assists in minimizing this slight depletion by providing an alternate conduction path that lowers the on-resistance of device 10. When device 10 is turned-on current flow is from drain 27, through stripes 17 and through portion 15 of first region 12, then through third section 24 to channel region 26, and then to source 18. First region 12 and stripes 17 form multiple parallel paths and function similarly to resistors all connected together in parallel to support the current flow. Since resistors in parallel form an equivalent resistor that has a lower value than the largest resistor in the parallel path, the addition of the resistor formed by first region 12 lowers the total on-resistance of device 10. When device 10 is turned-off, the depletion region between stripes 16 and 17 assists in depleting stripes 16 and 17 of mobile charge carriers. Furthermore, as discussed earlier, region 12 is also depleted of mobile charge carriers due to interaction with substrate 11. Depleting region 12 and stripes 16 and 17 of mobile charge carriers reduces the peak electric field within device 10 thereby increasing the breakdown voltage and preventing damage to device 10. Additionally, the depletion regions facilitate doping region 12 and stripes 16 and 17 to a higher doping concentration for a desired breakdown voltage thereby lowering the resistivity of stripes 17 and the on-resistance of device 10. Without the depletion regions, region 12 and stripes 17 would have to have lower doping concentrations and associated higher resistivity in order to achieve the same breakdown voltage.

The fourth section of region 12 between drain 27 and stripes 14 assists in providing device 10 a low on-resistance. It is believed that at source to drain voltages greater than three to five volts (3–5 Volts) there can be a pinch-off effect near drain 27 and that this pinch-off effect reduces the current capacity, thereby increasing the on-resistance. By spacing drain 27 from stripes 14 by distance 36, this pinch-off effect, and correspondingly the on-resistance, is reduced. Distance 36 is selected to provide a desired breakdown voltage with a minimum resistivity based on the on-state voltage drop thereby allowing device 10 to be compact. Distance 36 should be at least greater than zero and typically should be about twenty to forty per cent (20–40%) of the entire distance from drain 27 to source 18, and preferably is at least one-fourth to one-third of that distance.

The charge concentration and doping concentrations of stripes 16 and 17 and of first region 12 in addition to distance 21, distance 30, distance 36, height 22, and width 23 are chosen to provide the depletion of stripes 16 and 17 in the off-state of device 10 and to also provide a balance between on-resistance and breakdown voltage. Similarly, the charge concentration of region 12 is chosen to provide the maximum depletion region with substrate 11 and still provide a low on-resistance. Substrate 11 typically has a doping concentration of about 5E13 to 5E15 atoms/cm$^3$ and preferably is about 1E14 to 2E14 atoms/cm$^3$. Region 12 approximately has a charge concentration along its depth of 1E12 to 3E12 atoms/cm$^2$ and is preferably 1E12 atoms/cm$^2$ to assist in providing the desired depletion of region 12 and substrate 11. In an embodiment where device 10 is formed with silicon as its semiconductor material, it is believed that the maximum charge concentration for depleting a region is a charge of approximately 2E12 atoms/cm$^2$ times the number of junctions bounding the region. For example, each stripe 17 has a P-N junction on each side from each stripe 16, thus, two P-N junctions for each stripe 17. In such a case, in each stripe 17 the maximum charge concentration along it width 23 is approximately 4E12 atoms/cm$^2$. Thus, stripes 17 and interior stripes 16 can have a maximum charge concentration of approximately 4E12 atoms/cm$^2$ and typically are formed to charge concentration of about 2E12 atoms/cm$^2$. Stripes 16 at the outside or exterior sides of drift stripes 14, have a maximum charge concentration of approximately 2E12 atoms/cm$^2$ and typically 1E12 atoms/cm$^2$ because they are bounded by only one junction. Those skilled in the art will understand that forming the specified charge concentration is a desired goal and that the actual charge concentration may vary due to manufacturing variations, but that the actual charge concentration should vary no more than about five per cent (5%) from the specified charge concentration.

In one example of using device 10 as a high side driver, device 10 is an N-Channel lateral transistor having a P-type substrate 11 and well 13, and an N-type source 18 and drain 27. In this example a high voltage, for example a voltage between five hundred and seven hundred volts (500–700 volts), may be applied to drain 27 and a lower voltage, for example zero volts, may be applied to source 18. In this embodiment, device 10 is formed to have a breakdown voltage between five hundred and seven hundred volts (500–700 volts). To support such a breakdown voltage, width 23 is formed between one and three microns (1–3 microns), height 22 is three to ten microns (3–10 microns) and drift stripes 14 has about twelve (12) stripes 17. Also in this embodiment, distance 21 is forty to sixty microns (40–60 microns) to spread the voltage over a larger distance and assist in providing the high breakdown voltage in a small area. In this embodiment, first region 12 is formed to have a charge concentration of approximately 1E12 atoms/cm$^2$ and is depleted due to the junctions formed with substrate 11 and stripes 16.

Figure 3:
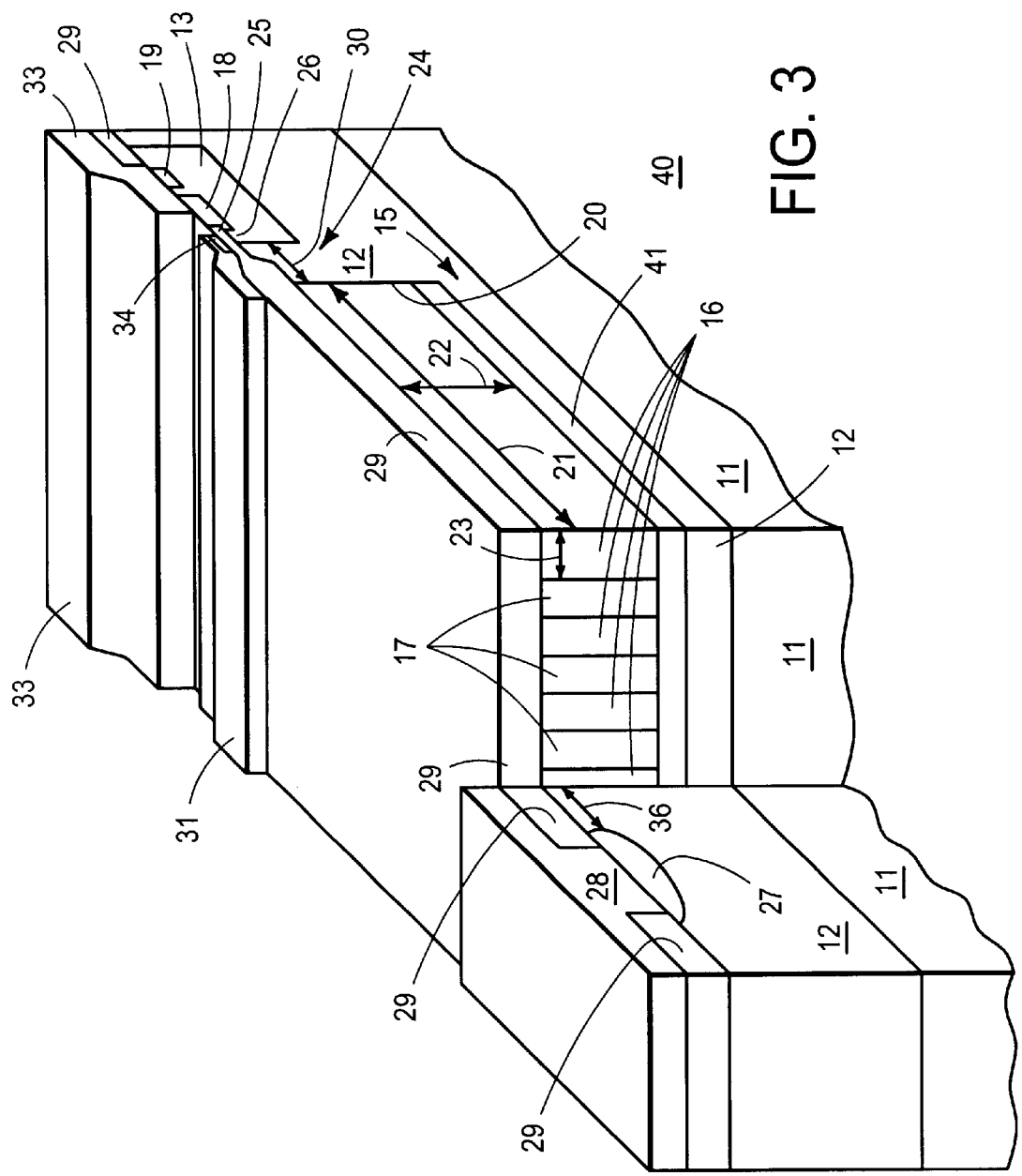
FIG. 3 schematically illustrates an enlarged cross-sectional isometric portion of a second embodiment of the semiconductor device of FIG. 2 in accordance with the present invention.

FIG. 3 schematically illustrates an enlarged cross-sectional isometric portion of a semiconductor device 40 that is an alternate embodiment of semiconductor device 10 explained in the description of FIG. 2. Semiconductor device 40 includes an additional base layer 41 formed of the first conductivity type within first region 12, or on a surface of region 12, and underlying drift stripes 14. Base layer 41 is formed to abut and form both physical and electrical contact to first region 12 in addition to drift stripes 14. Base layer 41 typically is formed subsequently to forming first region 12 and is formed by any well know technique such as ion implantation or dopant diffusion or selective epitaxial deposition or the like. In one embodiment, base layer 41 is formed as a well within first region 12 and stripes 17 are subsequently formed within a portion of the well leaving adjacent portions of the well to form stripes 16. Since base layer 41 is opposite conductivity to stripes 17, base layer 41 forms an additional P-N junction along the interface with each overlying stripe 17 and provides an associated depletion region extending vertically into stripes 17 from the interface. This additional P-N junction provides stripes 17 with three depletion regions, one from each side resulting from stripes 16 and one from the bottom resulting from layer 41. These three depletion regions assists in depleting stripes 14 and portion 15 of mobile charge carriers. Stripes 17 now have a higher charge concentration and associated doping concentration thereby further lowering the resistivity of each stripe 17 and lowering the on-resistance of device 40. In this embodiment, stripes 17 are formed to have a charge concentration between approximately 2E12 atoms/cm$^2$ and 4E12 atoms/cm$^2$ and preferably is about 3E12 atoms/cm$^2$. First region 12 now has two depletion regions one extending from the interface with substrate 11 and the other extending from the interface with base layer 41. Consequently, the charge concentration of first region 12 is increased and is formed between approximately 1E12 atoms/cm$^2$ and 3E12 atoms/cm$^2$ and preferably is about 2E12 atoms/cm$^2$ thereby further lowering the resistivity of first region 12 and further lowering the on-resistance of device 40.

Figure 4:
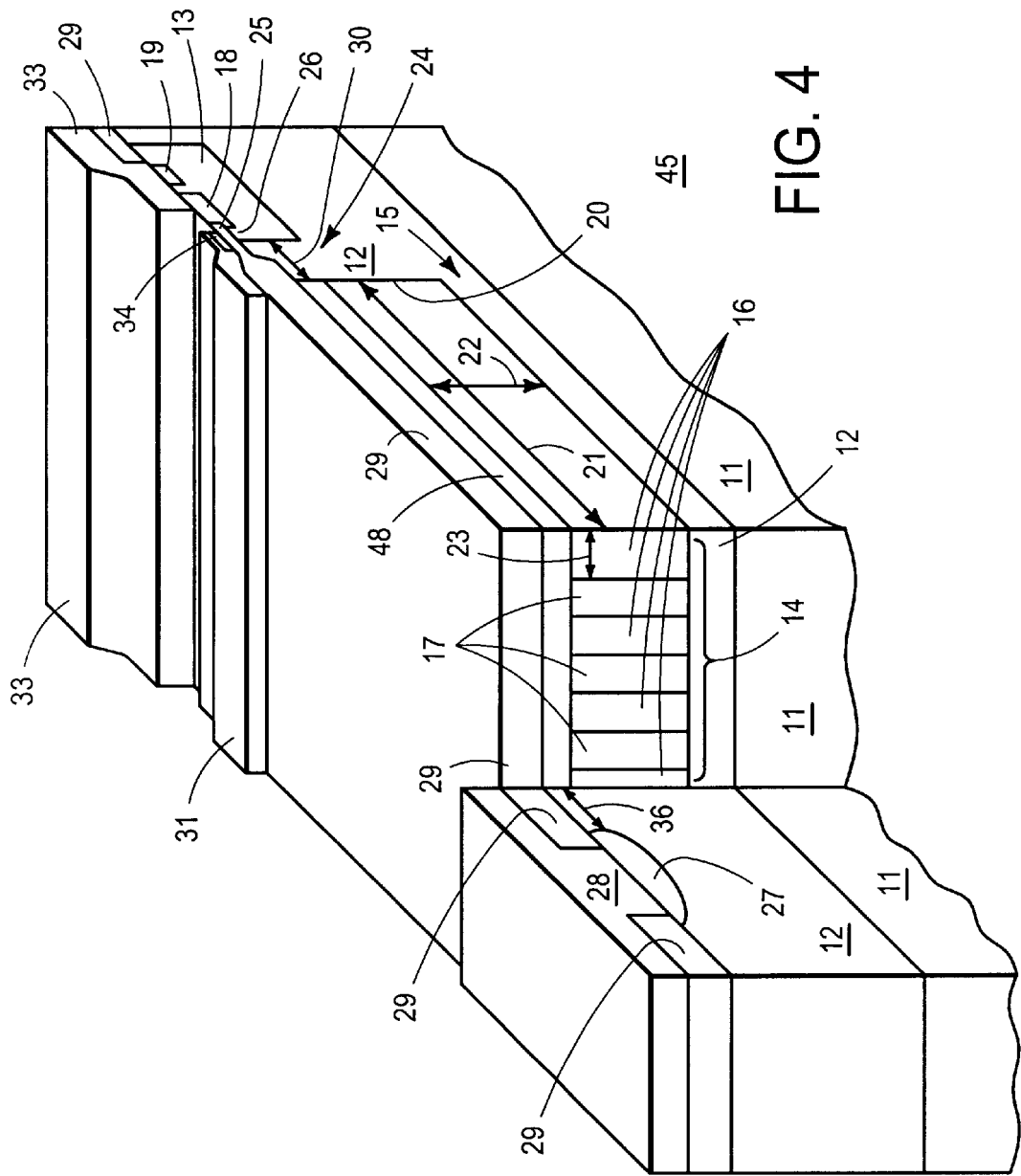
FIG. 4 schematically illustrates an enlarged cross-sectional isometric portion of a third embodiment of the semiconductor device of FIG. 2 in accordance with the present invention.

FIG. 4 schematically illustrates an enlarged cross-sectional isometric portion of a semiconductor device 45 that is an alternate embodiment of semiconductor device 10 explained in the description of FIG. 2. Semiconductor device 45 includes an additional cap layer 48 formed of the first conductivity type on a surface of drift stripes 14. Cap layer 48 typically is formed subsequent to forming drift stripes 14 and is formed by any well know technique such as ion implantation or epitaxial deposition or the like. Insulation layer 29 is subsequently formed on cap layer 48. Cap layer 48 forms both physical and electrical contact to drift stripes 14. Since cap layer 48 is opposite conductivity to stripes 17, cap layer 48 forms an additional P-N junction along the interface with each underlying stripe 17 and provides an associated depletion region extending vertically into stripes 17 from the interface. This additional P-N junction assists in depleting stripes 14 of mobile charge carriers. Stripes 17 now have three depletion regions, one from each side and one from cap layer 48, thereby allowing stripes 17 to have a higher charge concentration and associated doping concentration thereby further lowering the resistivity of each stripe 17 and lowering the on-resistance of device 45. In this embodiment, stripes 17 are formed to have a charge concentration between approximately 2E12 atoms/cm$^2$ and 4E12 atoms/cm$^2$ and preferably about 3E12 atoms/cm$^2$. Cap layer 48 separates drift stripes 14 from insulation layer 29.

Charges trapped in insulation layers can cause the on-resistance of devices to change after the devices are manufactured. Cap layer 48 protects device 45 from the effects of any trapped charges in layer 29 and provides device 45 with a stable on-resistance.

Figure 5:
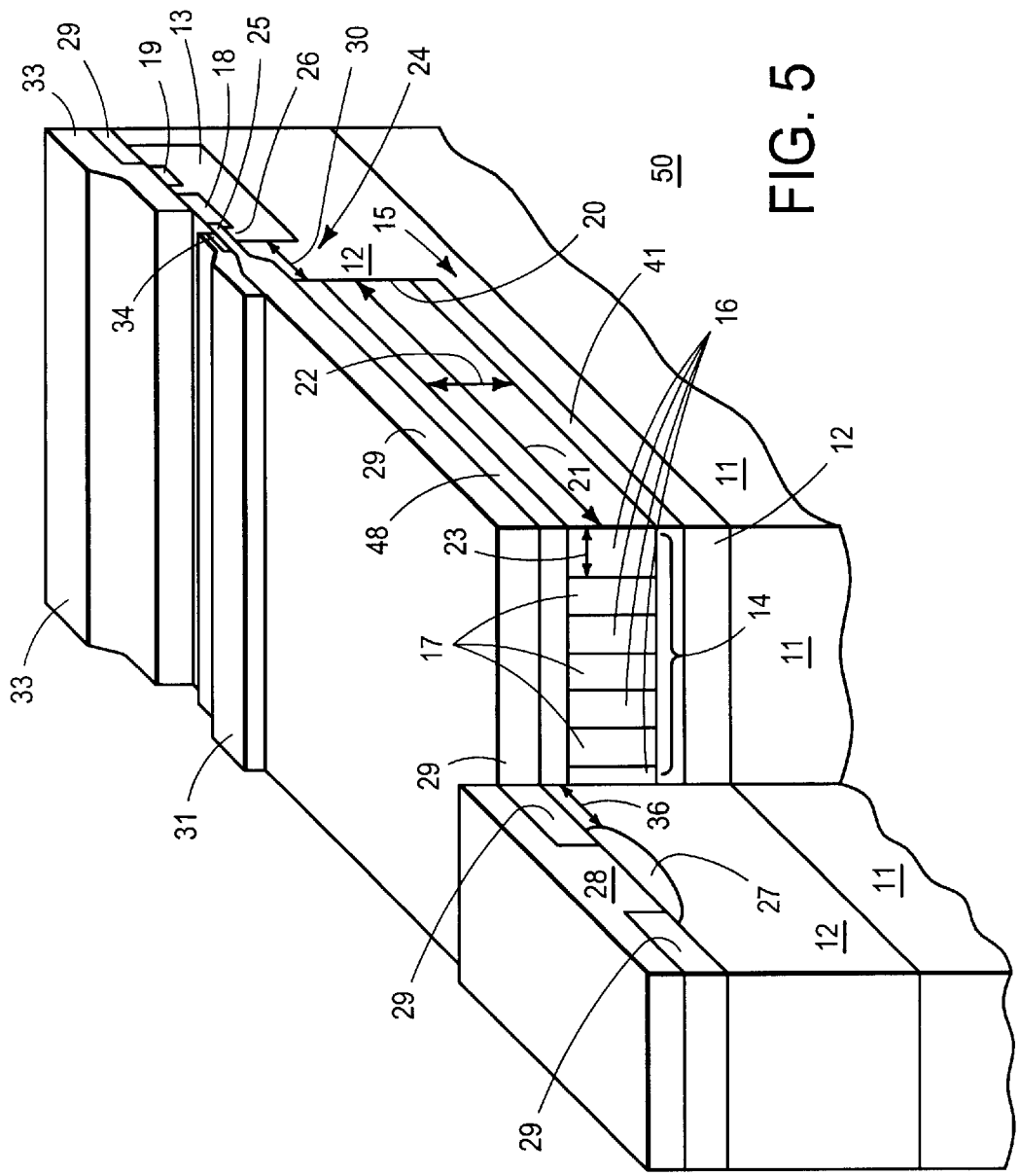
FIG. 5 schematically illustrates an enlarged cross-sectional isometric portion of a fourth embodiment of the semiconductor device of FIG. 2 in accordance with the present invention.

FIG. 5 schematically illustrates an enlarged cross-sectional isometric portion of a semiconductor device 50 that is an alternate embodiment of semiconductor device 10 explained in the description of FIG. 2. Semiconductor device 50 includes base layer 41 explained in the description of FIG. 3 and cap layer 48 explained in the description of FIG. 4. Base layer 41 underlies drift stripes 14 and forms electrical contact to drift stripes 14 and to portion 15 of first region 12. Cap layer 48 overlies drift stripes 14 and forms electrical contact to drift stripes 14. Base layer 41 and cap layer 48 both form P-N junctions along the interface with each stripe 17 and provides an associated depletion region extending into each stripe 17 from the interface. These two additional P-N junctions assist in depleting stripes 14 of mobile charge carriers. Stripes 17 now have four depletion regions, one from each side, one from the bottom, and one from the top. These four depletion regions facilitate forming each stripe 17 to have a higher charge concentration and associated doping concentration thereby further lowering the resistivity of each stripe 17 and lowering the on-resistance of device 50. In this embodiment, stripes 17 are formed to have a charge concentration between approximately 3E12 atoms/cm² and 5E12 atoms/cm² and preferably about 4E12 atoms/cm².

Figure 6:
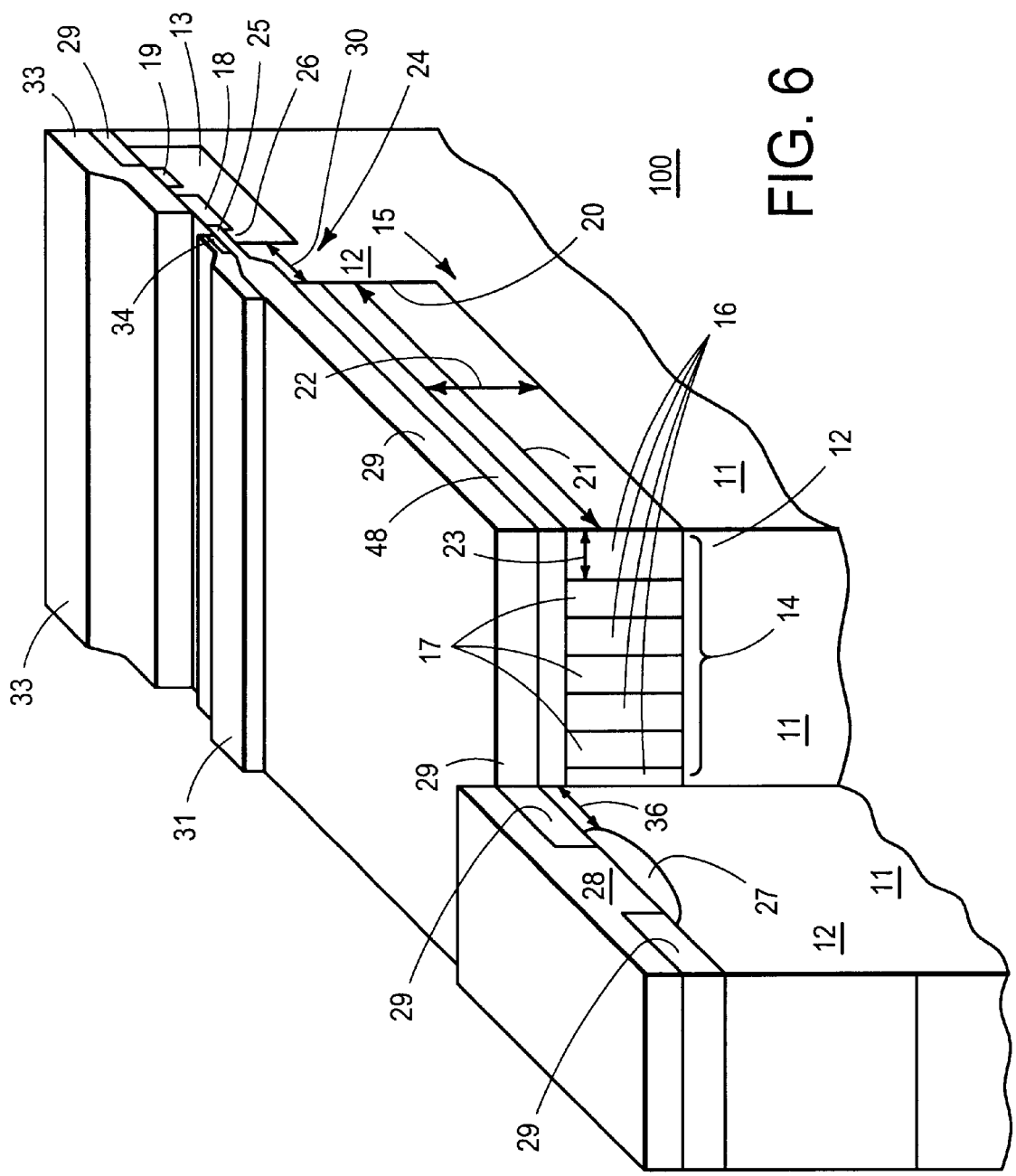
FIG. 6 schematically illustrates an enlarged cross-sectional isometric portion of another embodiment of a semiconductor device in accordance with the present invention.

FIG. 6 schematically illustrates an enlarged cross-sectional isometric portion of an embodiment of another semiconductor device 100 that has low on-resistance and high breakdown voltage. Semiconductor device 100 is formed similar to and functions similar to device 45 explained in the description of FIG. 4, however, device 100 is formed without region 12 that is explained in the description of FIGS. 1, 2, 3, and 4. Device 100 includes drift stripes 14 comprising stripes 16 and 17 that are explained in the description of FIG. 2. Semiconductor device 100 also includes cap layer 48 that is explained in the description of FIG. 4. Cap layer 48 overlies drift stripes 14 and forms electrical contact to drift stripes 14. Cap layer 48 typically is formed subsequent to forming drift stripes 14 and is formed by any well know technique such as ion implantation or epitaxial deposition or the like. Insulation layer 29 is subsequently formed on cap layer 48. Cap layer 48 forms both physical and electrical contact to drift stripes 14. Since cap layer 48 is opposite conductivity to stripes 17, cap layer 48 forms an additional P-N junction along the interface with each underlying stripe 17 and provides an associated depletion region extending vertically into stripes 17 from the interface. This additional P-N junction assists in depleting stripes 14 of mobile charge carriers. Stripes 17 have three depletion regions, one from each side and one from cap layer 48, thereby allowing stripes 17 to have a higher charge concentration and associated doping concentration thereby further lowering the resistivity of each stripe 17 and lowering the on-resistance of device 100. Cap layer 48 protects device 100 from the effects of any trapped charges in layer 29 and provides device 100 with a stable on-resistance.

Figure 7:
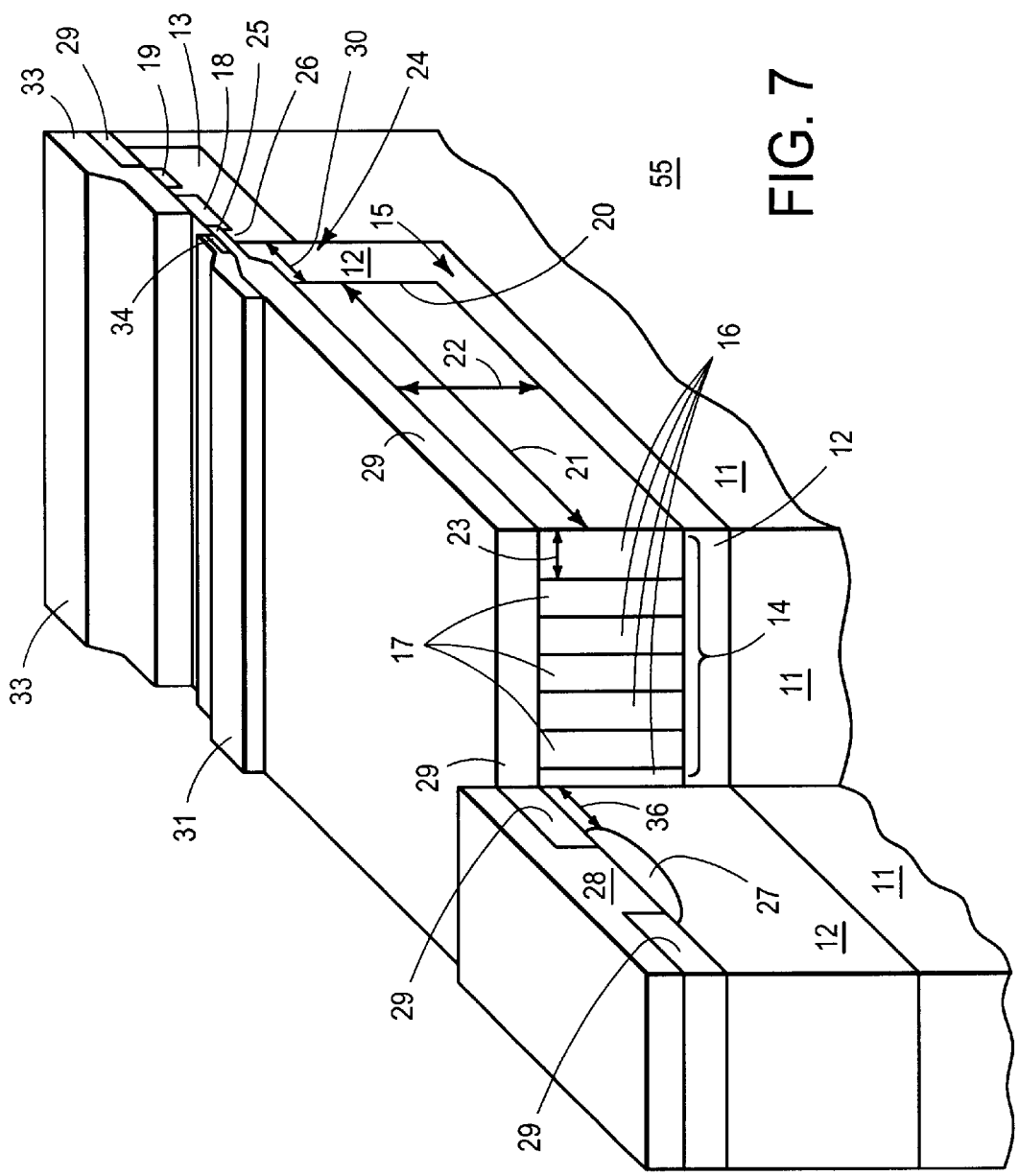
FIG. 7 schematically illustrates an enlarged cross-sectional isometric portion of a fifth embodiment of the semiconductor device of FIG. 2 in accordance with the present invention.

FIG. 7 schematically illustrates an enlarged cross-sectional isometric portion of a semiconductor device 55 that is an alternate embodiment of semiconductor device 10 explained in the description of FIG. 2. Semiconductor device 55 is formed similar to and functions similar to device 10 explained in the description of FIG. 2, however, device 55 is formed with first region 12 shortened so that well 13 is formed within a portion of substrate 11 adjacent to region 12 instead of within region 12. Device 55 can be utilized in various types of applications including other than high-side driver applications.

By now it should be apparent that a novel method is provided. Forming the first region between the drift region and the substrate facilitates using the devices in high side driver applications. Forming a cap layer overlying the drift region and a base layer underlying the drift region further reduces the on-resistance and increases the breakdown voltage. Forming a cap layer between the drift stripes and the insulation layer reduces on-resistance drift after the device is manufactured.

While the invention is described with specific preferred embodiments, it is evident that many alternatives and variations will be apparent to those skilled in the semiconductor arts. For example, the descriptions are of N-channel MOS transistors but similar structures with opposite conductivity types may be formed for P-Channel MOS transistors. Additionally, the invention has been described for a particular transistor structure, although the method is directly applicable to other structures including vertical transistors, as well as to BiCMOS transistors, metal semiconductor FETs (MESFETs), HFETS, IGBTS, and other transistor structures.

What is claimed is:

1. A method of forming a transistor comprising:
   providing a substrate of a first conductivity type;
   forming a first region of a second conductivity type on a portion of a surface of the substrate;
   forming within a first portion of the first region a drift stripe comprising a plurality of stripes of the second conductivity type wherein each stripe of the second conductivity type is abutted on at least two sides by a stripe of the first conductivity type including forming the plurality of stripes of the second conductivity type extending vertically into the first region, the drift stripe extending laterally a first distance through the first region toward a channel region of the transistor and terminating at a lateral end of the drift stripe; and
   forming the channel region spaced a second distance laterally from the lateral end of the drift stripe wherein a second Portion of the first region is interposed between the lateral end of the drift stripe and the channel region.

2. The method of claim 1 wherein forming within the first portion of the first region the drift stripe includes forming the plurality of stripes of the second conductivity type as a portion of a drift region of the transistor.

3. The method of claim 1 wherein forming within the first portion of the first region the drift stripe comprising the plurality of stripes of the second conductivity type includes forming each stripe of the plurality of stripes of the second conductivity type to abut a stripe of the first conductivity type on each side and on a top.

4. The method of claim 1 wherein forming within the first portion of the first region the drift stripe comprising the plurality of stripes of the second conductivity type includes forming each stripe of the plurality of stripes of the second conductivity type to abut a stripe of the first conductivity type on each side and on a bottom.

5. The method of claim 1 wherein forming within the first portion of the first region the drift stripe comprising the plurality of stripes of the second conductivity type includes forming each stripe of the plurality of stripes of the second conductivity type to abut a stripe of the first conductivity type on each side and on a bottom and on a top.

6. The method of claim 1 wherein forming within the first portion of the first region the drift stripe includes forming the drift stripe within a first section of the first region wherein a second section of the first region underlies the drift stripe.

7. The method of claim 1 wherein forming within the first portion of the first region the drift stripe includes forming the drift stripe within a first section of the first region and forming a second section of the first region underlying the drift stripe, forming a third section of the first region between the drift stripe and a the channel region, and forming a fourth section of the first region between the drift stripe an a drain of the transistor.

* * * * *